United States Patent [19]
Suh

[11] Patent Number: 6,140,841
[45] Date of Patent: Oct. 31, 2000

[54] HIGH SPEED INTERFACE APPARATUS

[75] Inventor: Jung Won Suh, Kyungki-Do, Rep. of Korea

[73] Assignee: Hyundai Electronics Industries Co., Ltd., Ichon-shi, Rep. of Korea

[21] Appl. No.: 09/342,222

[22] Filed: Jun. 29, 1999

[30] Foreign Application Priority Data

Jun. 29, 1998 [KR] Rep. of Korea ........................ 98-24833

[51] Int. Cl.[7] .................................................. H03K 19/00
[52] U.S. Cl. .................................. 326/60; 326/59; 341/50; 341/56; 341/57; 341/173; 375/214; 375/286; 375/287; 327/74; 327/93
[58] Field of Search ........................ 326/60, 59; 327/74, 327/93; 341/50, 56, 57, 173; 375/214, 286, 287

[56] References Cited

U.S. PATENT DOCUMENTS

| | | | |
|---|---|---|---|
| 4,875,049 | 10/1989 | Yoshida | 341/159 |
| 5,166,956 | 11/1992 | Baltus et al. | 375/17 |
| 5,426,739 | 6/1995 | Lin et al. | |
| 5,473,575 | 12/1995 | Farmwald et al. | |
| 5,737,357 | 4/1998 | Retzer | 375/200 |
| 5,790,454 | 8/1998 | Choi | 365/185.03 |
| 5,809,263 | 9/1998 | Farmwald et al. | |
| 5,815,439 | 9/1998 | Korsh et al. | 365/185.24 |
| 5,872,468 | 2/1999 | Dyke | 327/72 |
| 5,878,045 | 3/1999 | Timbs | |
| 5,923,276 | 7/1999 | Frankeny et al. | 341/155 |
| 5,963,053 | 10/1999 | Manohar et al. | 326/60 |

FOREIGN PATENT DOCUMENTS

| | | |
|---|---|---|
| 56-164650 | 12/1981 | Japan . |
| 60-194647 | 10/1985 | Japan . |
| 2-128201 | 5/1990 | Japan . |
| 8-202677 | 8/1996 | Japan . |
| 8-286943 | 11/1996 | Japan . |

*Primary Examiner*—Viet Q. Nguyen
*Attorney, Agent, or Firm*—Pennie & Edmonds LLP

[57] ABSTRACT

The present invention discloses a much higher speed interface apparatus which comprises a data driving means for decoding two-bit data signals using them as inputs to output four-level data signals; a reference voltage generating means for generating three-level reference voltages to discriminate the voltage levels of the four-level data signals; and a receiver means for comparing the four-level data signals and the three-level reference voltage signals using them as inputs and for encoding the resulting signals to output two data signals.

9 Claims, 5 Drawing Sheets

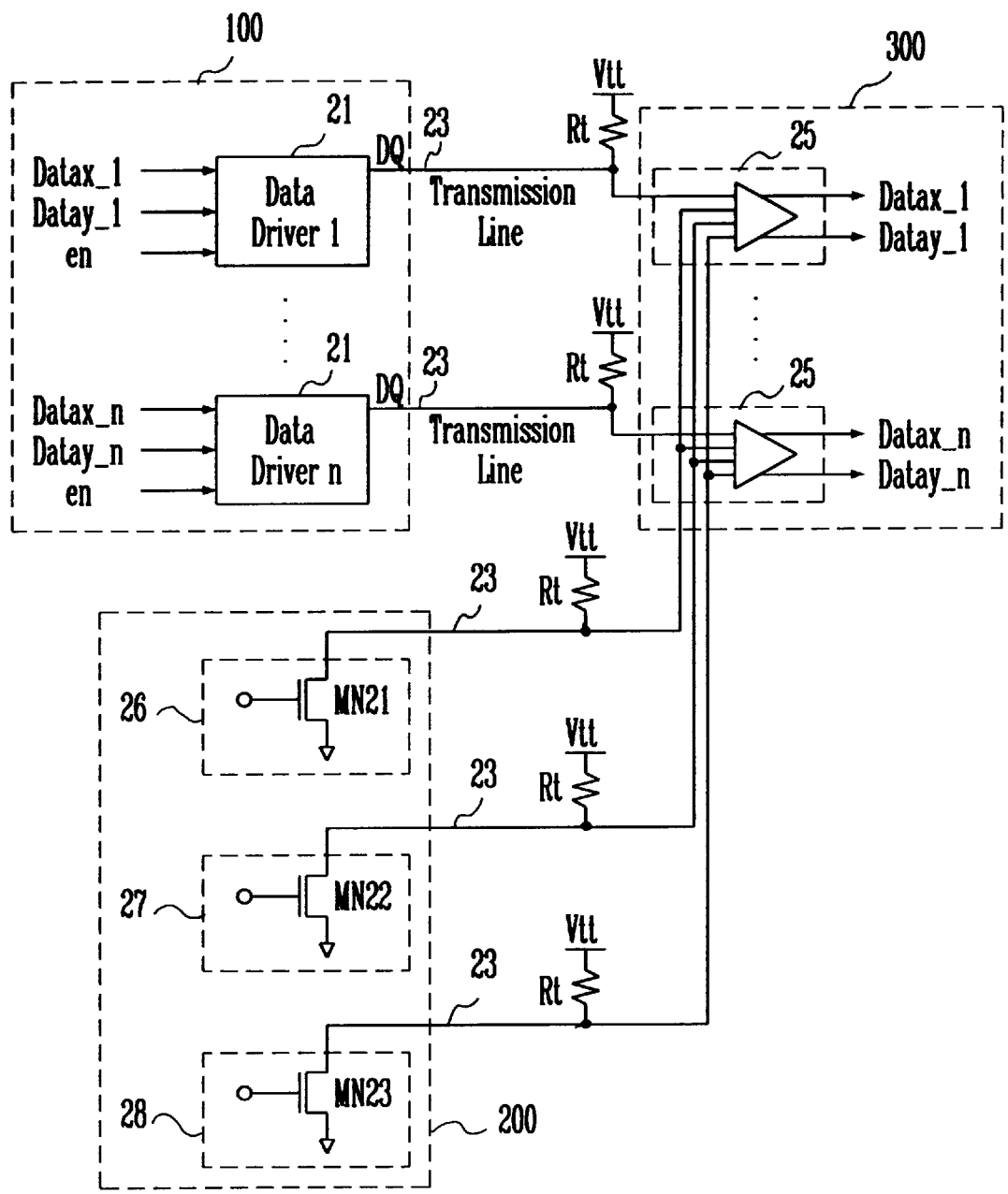

HIGH SPEED INTERFACE APPARATUS

FIELD OF THE INVENTION

1. Field of the Invention

The present invention relates to a much higher speed interface apparatus. In particular, the present invention relates to a much higher speed interface apparatus in which the bandwidth is widened twice, even with keeping the bus width and the system bus frequency thereof as they are, by provision of a reference voltage generating means for discriminating two-bit data signals.

2. Description of the Prior Art

Generally, DRAMs used in a main memory and a graphic card of the computer require a higher bandwidth for improved system performance, and thus necessitate a bus interface for switching data signals at high speed.

Thus, in past twenty years, the TTL bus interface has been widely used as an industry standard. However, the bus interface has the problems of increased power consumption, noises etc. at a system speed more than 50 MHz and also of limited high speed due to reflection of signal and occurrence of ringing.

To alleviate the above problems a little, conventionally a low voltage has been used. Especially, LVTTL(low voltage TTL) has been widely used at a system speed less than 100 MHz. However, it also has various problems such as increased power consumption, noises etc. at a system speed more than 100 MHz, similar to those of the TTL interface.

In order to solve these problems, recently there has been proposed a SSTL(stub series transceiver logic) interface or a RSL (rambus signaling logic) interface. However, since the high speed bus interfaces have to increase the system bus frequency or widen the bus width in order to increase the bandwidth, they have problems of increased power consumption, noises, electromagnetic interference(EMI), cost etc.

FIG. 1 shows the construction of a conventional interface apparatus in which a transmission line is a single termination. In FIG. 1, the interface apparatus includes N data drivers 11 for receiving data signals data_1~n, respectively, N transmission lines 13 each connected to the N data drivers 11 for transmitting the received data signals, respectively, and N receivers 15 for receiving the data signals transmitted through the transmission lines 13, comparing them with an external input reference voltage Vref and then outputting data signals, respectively. The interface apparatus further includes termination voltage application terminals Vtt and termination resistors Rt at the end of the transmission lines 13 so that reflection of the data signal transmitted through the transmission lines 13 can be prevented to reduce distortion of signal.

In the conventional interface apparatus having the above construction, the data signals are divided into two-levels of 'high' and 'low' on the basis of the external input reference voltage Vref and N bits of data are transmitted once via the N transmission lines 13. Also, the transmission lines 13 are terminated by the termination resistor Rt corresponding to their characteristics impedance, respectively, thus preventing a signal distortion due to reflection of the transmitted signals.

Due to the above operation, the conventional interface apparatus requires an increased bandwidth for a higher data transmission. However, since the bandwidth=system bus frequency x bus width, either the system bus frequency or the bus width must be increased twice so as to increase the bandwidth twice in the bus interface apparatus using two-levels, for example.

As above, the conventional interface apparatus unnecessarily requires increased bandwidth for high speed transmission. As a result, it has the problems of increasing input/output power consumption and system cost due to increased bus frequency and bus width, and also of further occurring noises and an electromagnetic interference etc.

SUMMARY OF THE INVENTION

It is an object of the present invention to solve the problems involved in the prior art, and to provide a much higher speed interface apparatus in which the bandwidth is widened twice, even with keeping the bus width and the system bus frequency thereof as they are.

To achieve the above object, the much higher speed interface apparatus according to the present invention comprises a data driving means for decoding two-bit data signals using them as inputs to output four-level data signals; a reference voltage generating means for generating three-level reference voltages to discriminate the voltage levels of the four-level data signals; and a receiver means for comparing the four-level data signals and the three-level reference voltage signals using them as inputs and for encoding the resulting signals to output two data signals.

Further, if the reference voltages generated from the reference voltage generating means are divided into two-levels of first and second driving voltages and an additional third reference voltage input from the receiver means is provided, the same high speed interface apparatus of performing twice higher transmission can be constructed.

BRIEF DESCRIPTION OF THE DRAWINGS

The above object, and other features and advantages of the present invention will become more apparent by describing the preferred embodiment thereof with reference to the accompanying drawings, in which:

FIG. 2 shows the construction of a high speed interface apparatus according to a first embodiment of the present invention;

DETAILED DESCRIPTION OF PREFERRED EMBODIMENT

Figure 1:
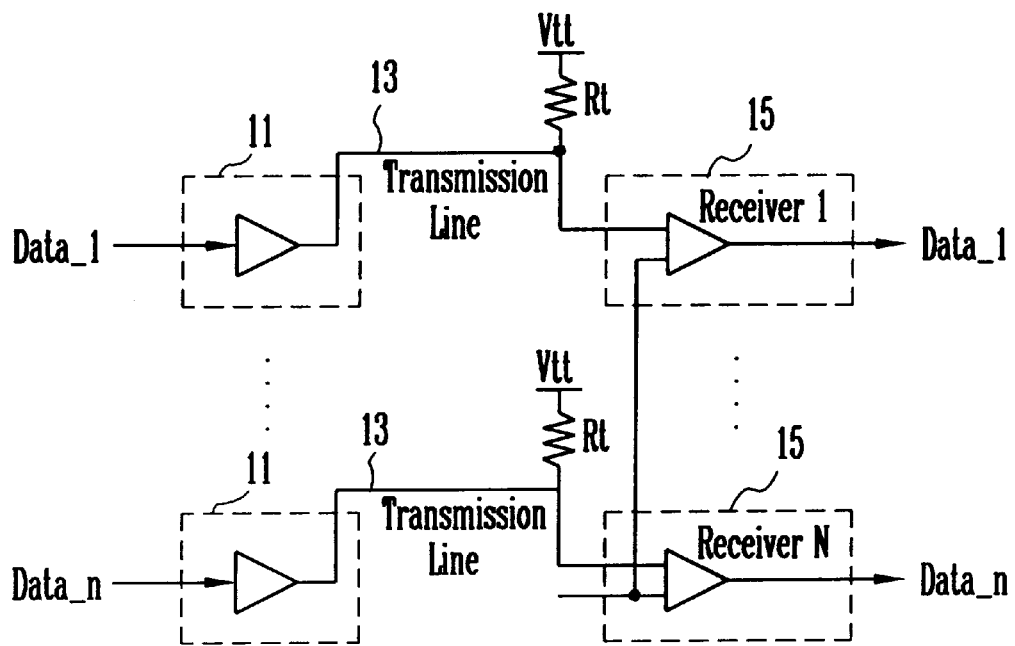
FIG. 1 shows the construction of a conventional interface apparatus.

FIG. 2 shows the construction of a high speed interface apparatus according to a first embodiment of the present invention. The high speed interface apparatus includes a data driving means 100 which is consisted of a plurality of N data drivers 21 for decoding two data signals (datax_1~n, datay_1~n) using them as inputs, respectively, to output two-bit data signals DQ; a reference voltage generating means 200 for generating three level reference voltages VR1 to VR3 to determine the two-bit data signals DQ; transmission lines 23 each connected to the data driving means 100 and the reference voltage generating means 200, for transmitting the two-bit data signals DQ and the three level reference voltages VR1 to VR3; a receiver means 300 which is consisted of N receiver 25, for comparing the two-bit data signals DQ transmitted by the transmission lines 23 with the three level reference voltages VR1 to VR3, respectively, and encoding the resulting signals to output two data signals (datax_1~n, datay_1~n); and termination resistors Rt connected to the terminal of the termination voltage Vtt and to the transmission lines 23, respectively, for preventing reflection of the data signals transmitted via the transmission lines 23, so that distortion of the signals can be reduced.

The operation of the high speed interface apparatus according to the present invention with the above construction will be now described in detail by reference to FIG. 3A.

Figure 3A:
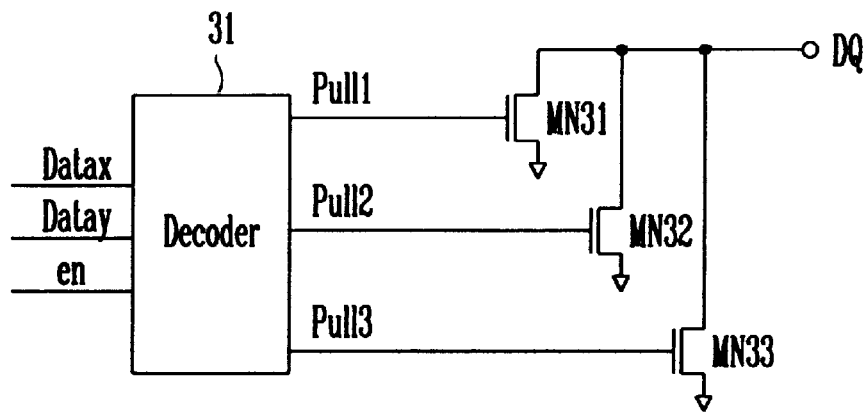
FIG. 3A shows the construction of a data driver shown in FIG. 2.

FIG. 3A shows in detail the data driver 21 shown in FIG. 2. The data driver 21 includes a two-input three-output decoder 31 for decoding two data signals (datax, datay) under the control of an enable signal en using them as inputs, and three N channel MOS transistors MN31 to MN33 connected between the data output terminal DQ and the ground Vss, respectively, each of the gates of which are connected to the output signals pull1 to pull3 of the decoder 31.

The true table representing the operational characteristics of the two-input three-output decoder 31 may be shown as the following table 1:

TABLE 1

| en | datax, datay | pull1 | pull2 | pull3 |
|---|---|---|---|---|
| 1 | 11 | 0 | 0 | 0 |
|  | 10 | 1 | 0 | 0 |
|  | 01 | 1 | 1 | 0 |
|  | 00 | 1 | 1 | 1 |
| 0 | don't care | 0 | 0 | 0 |

As can be seen from the table 1, the output signals (pull1 to pull3) of the decoder depend on four-levels (11,10,01,00) of the two-bit data signals. The output signals pull1 to pull3 of the decoder selectively drive the N channel MOS transistors MN31 to MN33 having a channel width of 2WN, so that their channel widths can be changed.

At this time, assuming that the driving current of the N channel MOS transistors having the channel width of WN is '+Io, the channel width, and the driving current and voltage of each of the two-bit data signals may be shown as the following table 2:

TABLE 2

| data signal | NMOS channel width | drive current | voltage |
|---|---|---|---|
| 11 | 0 | 0 | Vtt |
| 10 | 2WN | 2* Io | Vtt – 2 Δ V |
| 01 | 4WN | 4* Io | Vtt – 4 Δ V |
| 00 | 6WN | 6* Io | Vtt – 6 Δ V |

Then, the reference voltage generating means 200 each have 1WN, 3WN and 5WN, of the channel width and include first through third reference voltage VR1 to VR3 generating sections 26,27,28 each of which is consisted of N channel MOS transistors MN21, MN22, MN23 connected between the transmission lines 23 and the ground, respectively. The channel width and the voltage, which are driven by the signals of the first through three reference voltages VR1]=VR3, may be shown as the following table 3:

TABLE 3

| reference voltage | channel width | drive current | voltage |
|---|---|---|---|
| VR1 | 1WN | 1* Io | Vtt – 1 Δ V |
| VR2 | 3WN | 3* Io | Vtt – 3 Δ V |
| VR3 | 5WN | 5* Io | Vtt – 5 Δ V |

The first through three reference voltages VR1 to VR3 are used as a reference voltage Vref to discriminate the data signals transmitted through the transmission lines 23. As can be seen from tables 2 and 3, even though the prices, temperature and voltage may change, a constant voltage difference (ΔV) will be maintained between the four-level data signals 11,10,01,00 and the reference voltages VR1 to VR3, so that they are rarely affected by common mode noise.

Figure 3B:
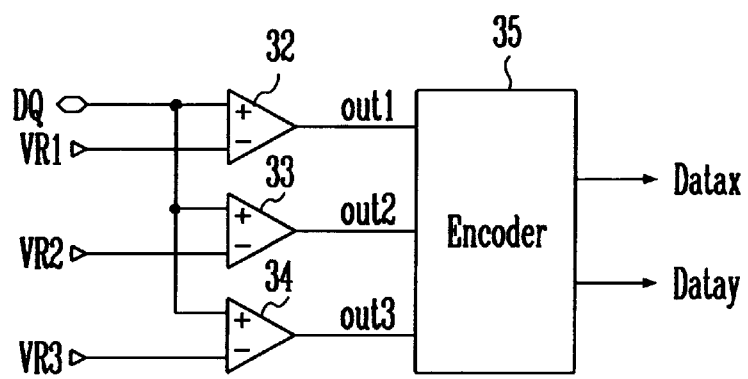
FIG. 3B shows the construction of a data receiver shown in FIG. 2.

Referring now to FIG. 3B, there is shown in detail the data receiver 25 shown in FIG. 2. The data receiver includes three comparators 32,33,34 for comparing a first input of the data signals DQ with a second input of the first through three reference voltages VR1 to VR3, respectively; and three-input two-output encoder 35 for encoding the output signals out1 to out3 from the comparators 32,33,34 using them as input, and then outputting two data signals (datax, datay).

The receiver 25 having the above construction compares the signals of the reference voltages VR1 to VR3 with the data signals 11,10,01,00, respectively, and outputs different values of signals as the output signals out1 to out3 of the comparators 32,33,34. Then, the output signals out1 to out3 of the comparators 32,33,34 are encoded by the encoder 35, thus outputting two-bit data signals.

The true table representing the operational characteristics of the encoder 35 may be shown as the following table 4:

TABLE 4

| out1 | out2 | out3 | datax | datay |
|---|---|---|---|---|
| 1 | 1 | 1 | 1 | 1 |
| 0 | 1 | 1 | 1 | 0 |
| 0 | 0 | 1 | 0 | 1 |
| 0 | 0 | 0 | 0 | 0 |

Figure 4:
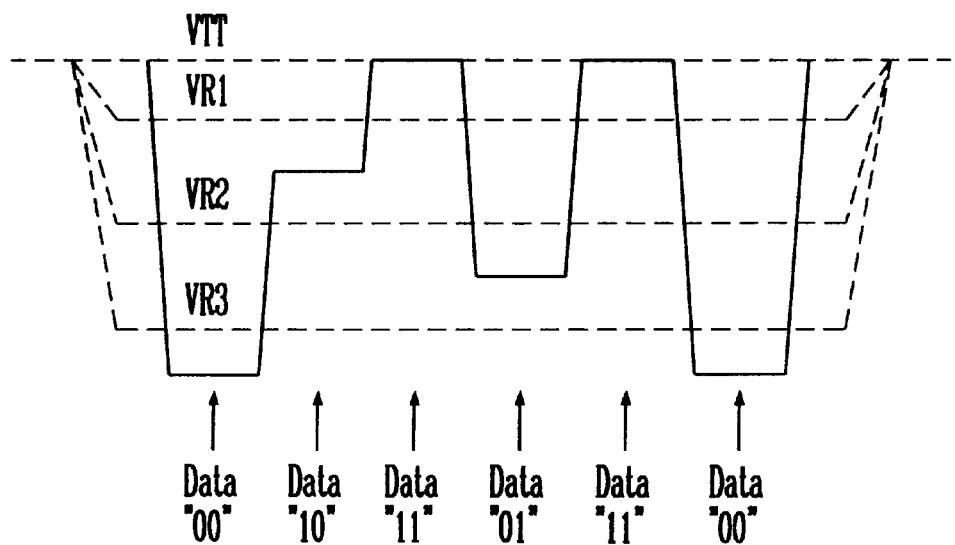
FIG. 4 shows data signal waveforms of the high speed interface apparatus shown in FIG. 2.

Referring to FIG. 4, there is shown data signal waveforms of the high speed interface apparatus shown in FIG. 2. At a standby state, both the data signals DQ and the reference voltage signals VR1 to VR3 are kept at a termination voltage Vtt. Thereafter, the data signals DQ are received by the receiver 25 via the transmission line 23, the driving sections 26,27,28 for the first though third reference voltages VR1 to VR3 drive the data signals DQ to become the voltage levels Vtt–1ΔV, Vtt–3ΔV and Vtt–5ΔV, respectively, as shown in table 3, so that the N data drivers 21 can be driven.

Thereafter, the voltages of the four data signal 11,10,01, 00 driven through the data drivers 21 are compared with the first through third reference voltages VR1 to VR3 having the voltage levels Vtt–1ΔV, Vtt-3ΔV and Vtt-5ΔV. Then the resulting values are discriminated through the comparators 32,33,34 consisting of the receiver 25 and then are encoded by the encoder 35, thereby simultaneously outputting two-bit data signals through the output terminal of the receiver 25. FIG. 4 shows signal waveforms at the time when the data signals 00,10,11,01,11,00 are continuously transmitted.

Figure 5:
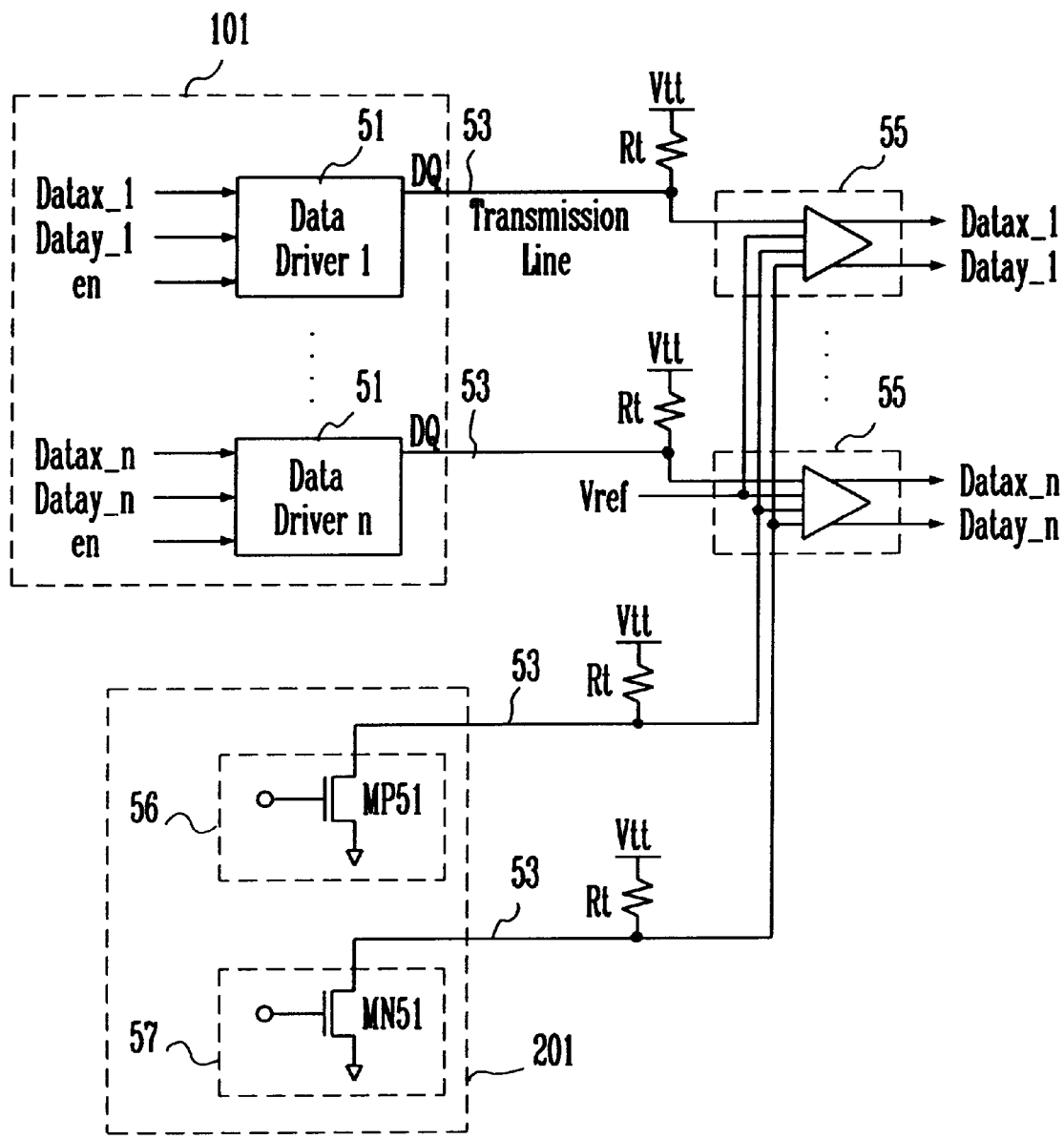
FIG. 5 shows the construction of a high speed interface apparatus according to a second embodiment of the present invention.

Next, FIG. 5 shows the construction of a high speed interface apparatus according to a second embodiment of the present invention. The high speed interface apparatus includes a data driving means 101 which is consisted of a plurality of N data drivers 51 for decoding two data signals (datax__1~n, datay__1~n) using them as inputs, respectively, to output two-bit data signals DQ; a reference voltage generating means 201 for generating two-level reference voltages VR1,VR2 to discriminate the two-bit data signals DQ; transmission lines 53 each connected to the data driving means 101 and the reference voltage generating means 201, for transmitting the two-bit data signals DQ and the two-level reference voltages VR1,VR2; N receiver means 55 for comparing four-level data signals DQ transmitted by means of the transmission lines 53 with the two-level reference voltage signals VR1,VR2 and a third reference voltage Vref which is input externally (the 'Vtt' is used as 'Vref'), respectively, and encoding the comparison result to output two-bit data signals (datax__1~n, datay__1~n); and termination resistors Rt connected to the terminal of the termination voltage Vtt and to the transmission lines 23, respectively, for preventing reflection of the data signals transmitted via the transmission lines 23, so that distortion of the signals can be reduced.

Figure 6A:
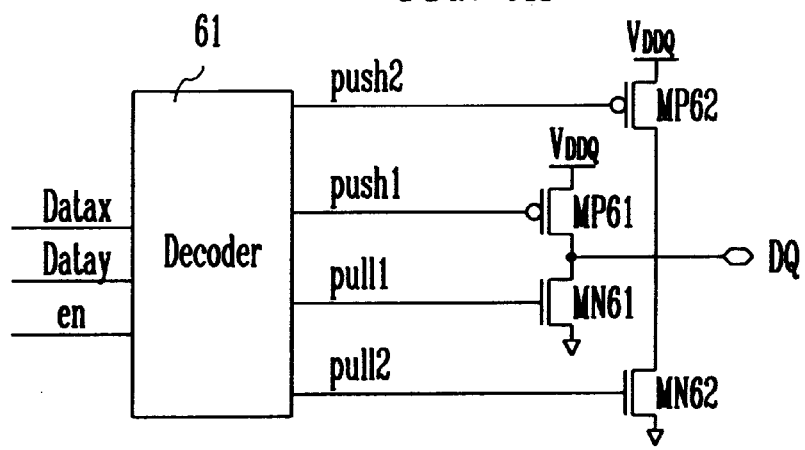
FIG. 6A shows the construction of a data driver shown in FIG. 5.

FIG. 6A shows in detail the data driver shown in FIG. 5. The data driver 51 includes a two-input four-output decoder 61 for decoding two data signals (datax, datay) using them as inputs under the control of the enable signal en to output first and second push/pull control signals (push1, pull1/push2, pull2); first PN channel MOS transistors MP61, MN61 connected between the supply power and the ground, the operations of which are controlled by the first push/pull control signals (push1, pull1) being the output signals of the decoder 61; and second PN channel MOS transistors MP62, MN62 connected between the supply power and the ground, the operations of which are controlled by the second push/pull control signals (push2, pull2) being the output signals of the decoder 61, wherein the connection node of the first PN channel MOS transistors MP61,MN61 is commonly connected to the connection node of the second PN channel MOS transistors MP62,MN62 through the output terminal of the data signal DQ.

However, it should be noted that the channel widths of the second PN channel MOS transistors MP2,MN2 are twice wide than that of the first PN channel MOS transistors MP1,MN1. Assuming that the four channel widths are to be 2WP, 2WN, 1WP, 1WN, respectively, an explanation will be below given.

In the data driver 51 having such construction, the output signals (push1, pull1/push2, pull2), being the output signals of the decoder 61, are different depending on the transmitted two-bit data signals. The PN channel MOS transistors are selectively driven depending on the output signals (push1/pull1, push2/pull2), thereby deciding the channel width accordingly. First, there will be shown table 5 which represents the operation of the decoder 61 depending on the data signals. Next, there will be shown table 6 which represents the driving current and voltage of each of the data signals, assuming that the current by which the N channel MOS transistor having the channel width of 1WN will be driven to be '+IO' and the current by which the P channel MOS transistor having the channel width of 1WP will be driven to be '-IO'.

TABLE 5

| en | datax, datay | push1 | push2 | pull1 | pull2 |
|---|---|---|---|---|---|
| 1 | 11 | 0 | 0 | 0 | 0 |
|   | 10 | 1 | 0 | 0 | 0 |
|   | 01 | 1 | 1 | 1 | 0 |
|   | 00 | 1 | 1 | 1 | 1 |
| 0 | don't care | 0 | 0 | 0 | 0 |

TABLE 6

| data signal | channel width | drive current | voltage |
|---|---|---|---|
| 11 | 3WP | $-3 \ast$ Io | Vtt + 3 Δ V |
| 10 | 1WP | $-1 \ast$ Io | Vtt + 1 Δ V |
| 01 | 1WN | $1 \ast$ Io | Vtt − 1 Δ V |
| 00 | 3WN | $3 \ast$ Io | Vtt − 3 Δ V |

Then, the reference voltage generating means 201 shown in FIG. 5 have the channel widths of 2WP, 2WN, respectively, and include first and second reference voltage generating sections 56,57 each of which is consisted of P,N channel MOS transistors MP51,MN51 connected between the supply power and the transmission line 53, and between the connection section of the transmission line and the ground, respectively.

The two reference voltage VR1,VR2 which are generated from the first and second reference voltage generating sections 56,57 and the third reference voltage (Vref:Vtt) are used as a comparing voltage for discriminate transmitted data signals.

Table 7 below represents the current by which the reference voltage VR1,VR2 are driven and its voltage.

TABLE 7

| reference voltage | channel width | drive current | voltage |
|---|---|---|---|
| VR1 | 2WP | $-2 \ast$ Io | Vtt + 2 Δ V |
| VR2 | 2WN | $2 \ast$ Io | Vtt − 2 Δ V |

Thus, according to the present invention, even though the process, temperature and voltage will change, a constant voltage difference (ΔV) can be maintained between the voltages (Vtt+3ΔV, Vtt+1ΔV, Vtt−1ΔV and Vtt−3ΔV) of the data signals (11,10,01,00), and the reference voltage (VR1, Vref, Vref:Vtt+2ΔV, Vtt, Vtt−2ΔV), thus giving less influence due to a common mode. (see Table 6 and 7)

Figure 6B:
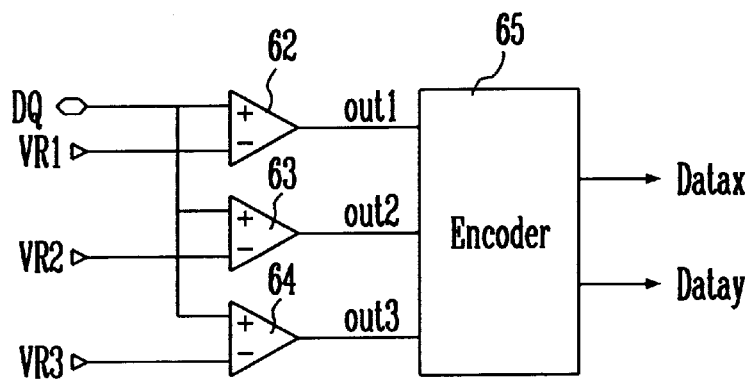
FIG. 6B shows the construction of a data receiver shown in FIG. 5.

Referring now to FIG. 6B, there is shown in detail the data receiver 55 shown in FIG. 5. The data receiver 55 includes three comparators 62 to 64 for comparing the four-level data signals DQ output from the data driver 51, which is used as a first input, with the two-level reference voltages VR1,VR2 and externally input third reference voltage Vref, each of which is used as a second input, respectively; and an encoder 65 for encoding the output signals out1 to out3 from the comparators 62 to 64 using them as inputs, and then outputting two-bit data signals (datax, datay) simultaneously.

The operational characteristics of the encoder 65 is same to those of the encoder 35 shown in FIG. 3B and thus will be omitted hereinafter.

Figure 7:
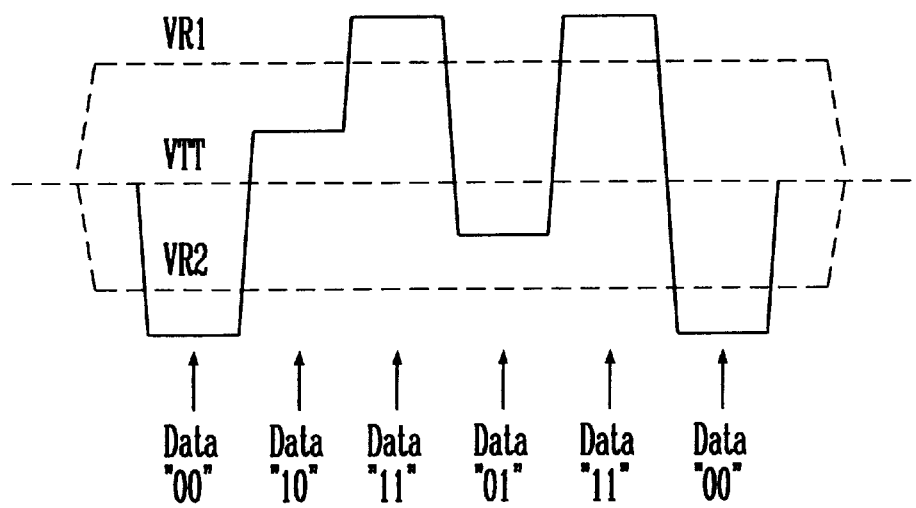
FIG. 7 shows data signal waveforms of the high speed interface apparatus shown in FIG. 5.

Referring to FIG. 7, there is shown data signal waveforms of the high speed interface apparatus shown in FIG. 5. At a standby state, both the data signals (11,10,01,00) and the reference voltage signals (VR1,VR2,Vref) are kept at the termination voltage Vtt. Thereafter, when the data signals DQ are received by the reveiver via the transmission lines, the first and second reference voltages generating sections 56,57 drive the data signals DQ to become the voltage levels 'Vtt+2ΔV', 'Vtt−2ΔV, thus driving the data drivers 51. In the figure, there are shown signal waveforms when the data signals 00,10,11,01,11,00 are continuously transmitted.

As described above, the high-speed interface apparatus according to the present invention has an outstanding effect that it can increase the bandwidth twice without additionally increasing the bus width and the system bus frequency, by provision of a reference voltage generating means for discriminating four-levels of the two-bit data signals.

Further, it provides an outstanding effect that it can realize a stabilized circuit operation by reducing effects by a common mode noise since the voltage difference between the data signal and the reference voltage is always kept to be constant.

While the present invention has been described and illustrated herein with reference to the preferred embodiment thereof, it will be understood by those skilled in the art that various changes in form and details may be made therein without departing from the spirit and scope of the invention.

What is claimed is:

1. A high speed interface apparatus, comprising:

a data driving means for decoding two-bit data signals, using them as inputs, to output four-level data signals;

a reference voltage generating means for generating multi-level reference voltages to discriminate the voltage levels of said four-level data signals; and a receiver means for comparing said four-level data signals and said multi-level reference voltage signals, and externally input reference voltage signals using them as inputs, respectively, and for encoding the outputted signals to output two-bit data signals, simultaneously.

2. The apparatus as claimed in claim 1, wherein said data driver means includes a plurality of data drivers, in which each data driver comprising:

a two-input four-output decoder for decoding two data signals using them as inputs under the control of an enable signal to output first and second push/pull control signals;

first PN channel MOS transistors connected between the supply power and the ground, the operations of which being controlled by said first push/pull control signals; and second channel MOS transistors connected between the supply power and the ground, the operations of which being controlled by said second push/pull control signals.

3. The apparatus as claimed in claim 2, wherein the channel widths of said second PN channel MOS transistors are twice wider than those of said first PN channel MOS transistors.

4. The apparatus as claimed in claim 3, wherein the channel widths of said second PN channel MOS transistors are 2WP,2WN and the channel widths of said first PN channel MOS transistors are 1WP,1WN.

5. The apparatus as claimed in claim 1, wherein said reference voltage generating means includes first and second reference voltage generating sections for generating different voltage levels.

6. The apparatus as claimed in claim 5, wherein said first reference voltage generating section includes a P channel MOS transistor connected between the ground and one input terminal of said receiver means.

7. The apparatus as claimed in claim 5, wherein said second reference voltage generating section includes a N channel MOS transistor connected between the ground and one input terminal of said receiver means.

8. The apparatus as claimed in claim 5 wherein, said first and second reference voltage generating means have the channel widths of 2WP and 2WN.

9. The apparatus as claimed in claim 1, wherein said receiver means includes first through third comparators for comparing said four-level data signals and said two-level reference voltages, and said externally input reference voltages using them as inputs, respectively; and an encoder for encoding the output signals of said first through third comparators using them as inputs and to simultaneously output two-bit data signals to the output terminals thereof.

* * * * *